United States Patent
Zhong

(10) Patent No.: US 6,938,228 B1
(45) Date of Patent: Aug. 30, 2005

(54) SIMULTANEOUSLY SIMULATE MULTIPLE STIMULI AND VERIFICATION USING SYMBOLIC ENCODING

(75) Inventor: John Xiaoxiong Zhong, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 130 days.

(21) Appl. No.: 10/199,539

(22) Filed: Jul. 19, 2002

Related U.S. Application Data

(60) Provisional application No. 60/306,693, filed on Jul. 20, 2001.

(51) Int. Cl.[7] ............................................. G06F 17/50
(52) U.S. Cl. ..................... 716/4; 716/5; 703/14; 703/19
(58) Field of Search ............................. 716/4, 5, 19, 14

(56) References Cited

U.S. PATENT DOCUMENTS

| | | | |
|---|---|---|---|
| 5,752,000 A | | 5/1998 | McGeer et al. |
| 5,910,897 A | * | 6/1999 | Dangelo et al. ............... 716/19 |
| 6,138,266 A | | 10/2000 | Ganesan et al. |
| 6,295,623 B1 | * | 9/2001 | Lesmeister et al. ......... 714/741 |
| 6,378,112 B1 | * | 4/2002 | Martin et al. ................... 716/5 |
| 6,609,230 B1 | * | 8/2003 | Li ................................ 716/5 |
| 6,634,012 B2 | * | 10/2003 | Zhong et al. .................. 716/5 |
| 2003/0115559 A1 | * | 6/2003 | Sawada ........................ 716/5 |
| 2003/0115562 A1 | * | 6/2003 | Martin et al. .................. 716/5 |

OTHER PUBLICATIONS

H. Barringer et al., A Design and Verification Environment for ELLA, IFIP International Conference on Very Large Scale Integration, pp. 685-690, Sep. 1995.*

C. Seger, VOSS—A Formal Hardware Verification System User's Guide, Technical Report TR-93-45, University of British Columbia, Dec. 1993.*

* cited by examiner

*Primary Examiner*—A. M. Thompson
(74) *Attorney, Agent, or Firm*—Bever, Hoffman & Harms, LLP; John M. Kubodera

(57) ABSTRACT

A method and apparatus for simulating multiple stimuli using symbolic encoding. In one embodiment, the method comprises encoding a plurality of sets of stimulus to create a symbolic stimulus, symbolically simulating a device under test, including applying the symbolic stimulus to the device under test, and outputting a symbolic result from the device under test in response to the symbolic stimulus.

20 Claims, 4 Drawing Sheets

SIMULTANEOUSLY SIMULATE MULTIPLE STIMULI AND VERIFICATION USING SYMBOLIC ENCODING

This application claims the benefit of provisional Application No. 60/306,693 filed Jul. 20, 2001.

FIELD OF THE INVENTION

The present invention relates to the field of design verification; more particularly, the present invention relates to using symbolic encoding of multiple stimuli to enable simultaneous application of multiple sets of stimuli to a device under test.

BACKGROUND OF THE INVENTION

FIG. 1 illustrates a prior art binary simulation verification environment. Referring to FIG. 1, a series of stimulus, referred to herein as $stimulus_1$–$stimulus_M$, are applied to a device under test (DUT) 101. The stimuli are usually values that are to be assigned to specific input ports of DUT 101 at specific times. In response to the series of stimulus, a series of corresponding outputs are generated, referred to herein as $output_1$–$output_M$. Each of the $output_1$–$output_M$ represents sets of values that are output on the output ports of DUI 101, where such sets in each output of $output_1$–$output_M$ corresponds to a particular time and in response to a particular set of stimulus values, in particular, one of $stimulus_1$–$stimulus_M$. The series of stimulus, $stimulus_1$–$stimulus_M$, are also applied to a reference model 102, which generates a series of expected outputs, referred to herein as expected_$output_1$–expected_$output_M$, respectively. The outputs, $output_1$–$output_M$, generated by DUT 101 are compared to expected_$output_1$–expected_$output_M$ to verify that DUT 101 is operating as expected.

Hardware Description Language (HDL) simulators/accelerators are the primary tools used to simulate and verify the designs described in HDL, such as Verilog HDL or VHDL. Most of popular software tools such as NCVerilog of Cadence Corporation of San Jose, Calif., VCS of Synopsys of Mountain View, Calif., and Modelsim of Mentor Graphics of Wilsonville, Oreg. are designed to speed up the simulation of a single testcase. Some are for the hardware accelerators and emulators such as emulators from Cadence and Quickturn. Similarly, U.S. Pat. Nos. 5,752,000 or 6,138,266 describe accelerators and emulators. Methods and tools both in research and commercial forms have been devised to do parallel simulation of a HDL design, which requires more than one physical processor to achieve any speedup in performing the simulation.

Some simulation tools claim to be able to simulate multiple stimuli by using 1 or 2 bits per stimulus for a computer with multiple bits such as 32-bit machines. Such a method could allow one to simultaneously simulate more than 1 stimuli but not more than 32 stimuli at the same time.

Traditional symbolic simulation is another technique used for formal verification. In the traditional symbolic simulation, the input stimulus is always thought to be encoded as variables.

Symbolic model checking, similar to symbolic simulation, assumes the inputs to take free variables with proper constraints (if there is any) at each clock cycle.

SUMMARY OF THE INVENTION

A method and apparatus for simulating multiple stimuli using symbolic encoding. In one embodiment, the method comprises encoding a plurality of sets of stimulus to create a symbolic stimulus, symbolically simulating a device under test, including applying the symbolic stimulus to the device under test, and outputting a symbolic result from the device under test in response to the symbolic stimulus.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
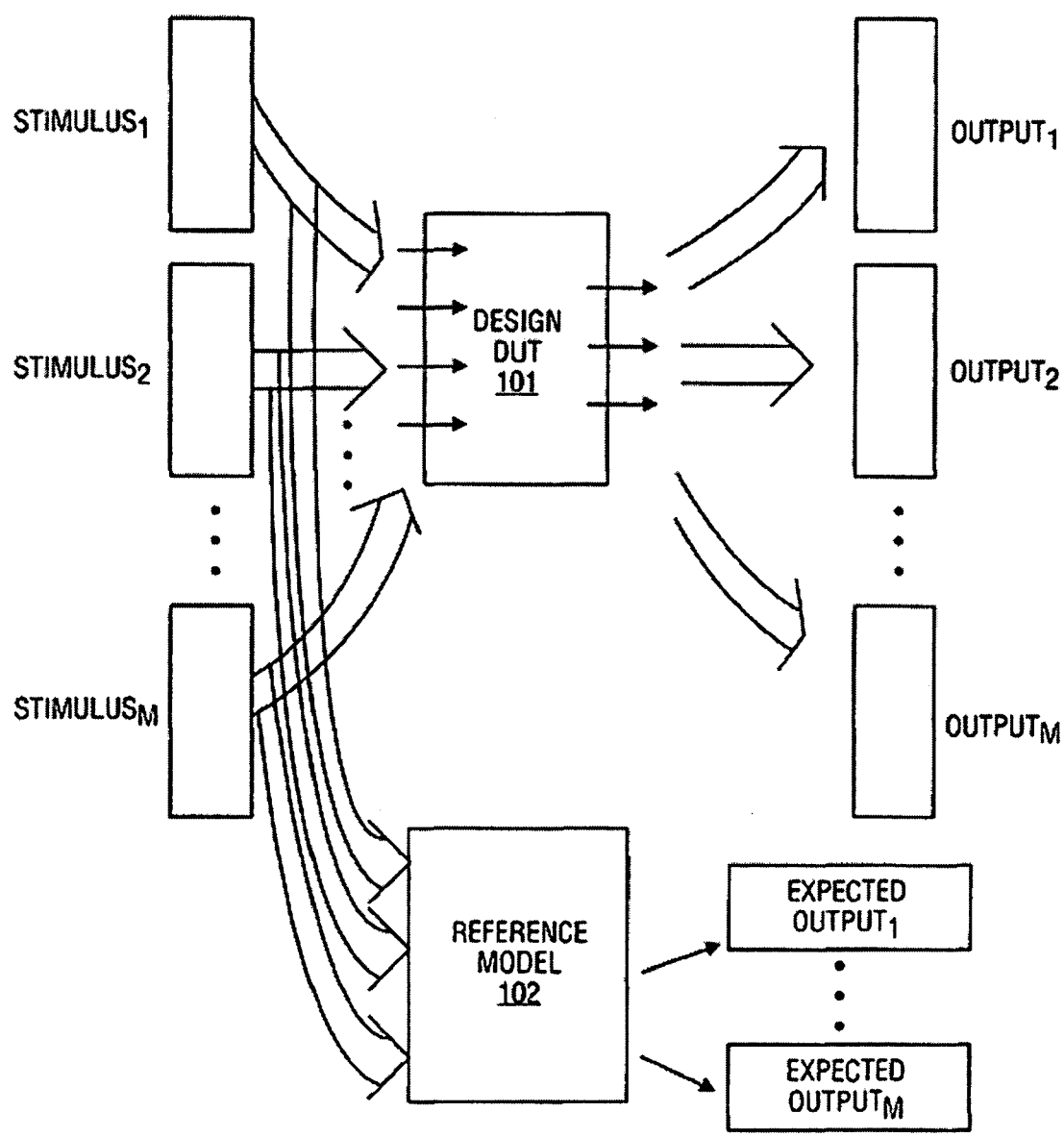
FIG. 1 illustrates a prior art binary simulation verification environment.

A method and apparatus for formal verification is described. The verification technique encodes discrete, multiple existing stimuli and the expected output using symbolic representation and achieves the simulation results through symbolic simulation of the design with the symbolic stimulus.

The techniques herein improve the performance of hardware design verification simulation and/or the coverage significantly by simultaneously simulating millions and tens of millions of test cases at one time while using a single execution processor. Thus, the teachings described herein use symbolic encoding without restrictions based on the limit of the computer machine word width.

There are a number of advantages that are associated with the present invention. One of the advantages is to improve simulation performance significantly by encoding and executing millions or even trillions of existing testcases in one symbolic simulation run on a single processor. Another advantage is to improve simulation coverage significantly since more testcases or stimuli could be run using the technique described herein while using the same computing power. Still another advantage is that the technique described herein fits into the existing simulation methodology very well.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Overview

Stimuli and the Outputs

Without loss of generality, assume that a design under test (DUT) is driven by a stimulus to its input ports $IN_1, \ldots, IN_n$ (if an internal signal is driven directly by the stimulus, one could always assume this signal as an input signal too). Furthermore, an in/out (I/O) signal could be conceptually thought of being represented by one input and one output signal. Further assume that the DUT has output ports $OUT_1, \ldots, OUT_n$. Similar to the input ports, if an internal signal's value needs to be examined by the tester, such a signal could be thought as an output signal.

In general, a stimulus Sq could be thought as the following

| Time | $IN_1, \ldots, IN_n$ |
|---|---|
| $t_1$ | $Vq\_1_1, \ldots, Vq\_1_n$ |
| $t_2$ | $Vq\_2_1, \ldots, Vq\_2_n$ |
| $\ldots$ | |
| $t_k$ | $Vq\_k_1, \ldots, Vq\_k_n$ |
| $\ldots$ | |

It is clear from above that at time $t_k$, $IN_1$ is driven by value $Vq\_k_1, \ldots, IN_n$ is driven by value $Vq\_k_n$. Notice those values need not be different than those at time $t_{k-1}$. Furthermore, throughout this discussion, values could be thought to be either 0,1 in a two values system or even values 0,1,X,Z in a four values system.

Assume that the output value change of the DUT for the stimulus Sq as the following

| Time | $OUT_1, \ldots, OUT_n$ |
|---|---|
| $T_1$ | $Oq\_1_1, \ldots, Oq\_1_n$ |
| $T_2$ | $Oq\_2_1, \ldots, Oq\_2_n$ |
| $\ldots$ | |
| $T_j$ | $Oq\_j_1, \ldots, Oq\_j_n$ |
| $\ldots$ | |

Notice that $T_i$ might not be the same as $t_i$.

The output value change is the response or the simulation result of the design DUT based on the stimulus of its input ports.

Encoding of Stimuli

Assume that there are m+1 stimuli, referred to as $S_0, \ldots, S_m$. Without loss of generality and for the simplicity of the description herein, it is further assumed $m+1=2^p$. Introduce p Boolean variables $U_1, \ldots, U_p$. The encoded symbolic stimulus SS is represented as follows

| Time | $IN_1, \ldots, IN_n$ |
|---|---|
| $t_1$ | $Z1_1, \ldots, Z1_n$ |
| $t_2$ | $Z2_1, \ldots, Z2_n$ |
| $\ldots$ | |
| $t_k$ | $Zk_1, \ldots, Zk_n$ |
| $\ldots$ | | where $Z_{ki}$ (1<=i<=n) is the following symbolic value, encoded as $Z_{ki}=\sim U1\sim U2\ldots UpV0\_ki+\sim U1\sim U2\ldots UpV1\_ki+\ldots +U1U2\ldots UpVm\_ki$ Stimulus 0 is associated with its binary encoded vector $(0, \ldots, 0)$, stimulus 1 is associated with its binary encoded vector $(0, \ldots, 1)$. In general, stimulus 1 is associated with its binary encoded vector for I as $(V1, V2, \ldots, Vp)$. Furthermore, associate a boolean value $W1W2\ldots Wp$; where $Wi=Ui$ if $Vi=1$; else $Wi=\sim Ui$ (not Ui) if $Vi=0$.

Symbolic Execution of the Encoded Stimulus/Interpretation of the Symbolic Simulation Result After applying the encoded stimulus SS to the DUT using symbolic simulation, the result of the symbolic simulation is as follows:

| Time | $OUT_1, \ldots, OUT_n$ |
|---|---|
| $T_1$ | $Y1_1, \ldots, Y1_n$ |
| $T_2$ | $Y2_1, \ldots, Y2_n$ |
| $\ldots$ | |
| $T_j$ | $Yj_1, \ldots, Yj_n$ |
| $\ldots$ | |

The result of $Y_{ji}$ should be $$Y_{ji} = \sim U1 \sim U2 \ldots \sim Up O1\_ji + \sim U1 \sim U2 \ldots Up O2\_ji + \ldots + U1U2 \ldots Up Om\_ji$$

Thus, the output value of port OUT i at time $T_j$ for stimulus Sq is equal to Yji being cofactored with (U1=v1, U2=v2, ... ,Up=vp), which should be Oq_ji.

Thus, a single symbolic simulation run captures all S1, ... ,Sm runs. If logm is smaller such as 20 or 30, the symbolic simulation run is very feasible based on current symbolic manipulation and simulation technologies. For logm=30, this means that the encoding, symbolic simulation and decoding process will handle $2^{30}$ or one billion of test stimuli.

Figure 2:
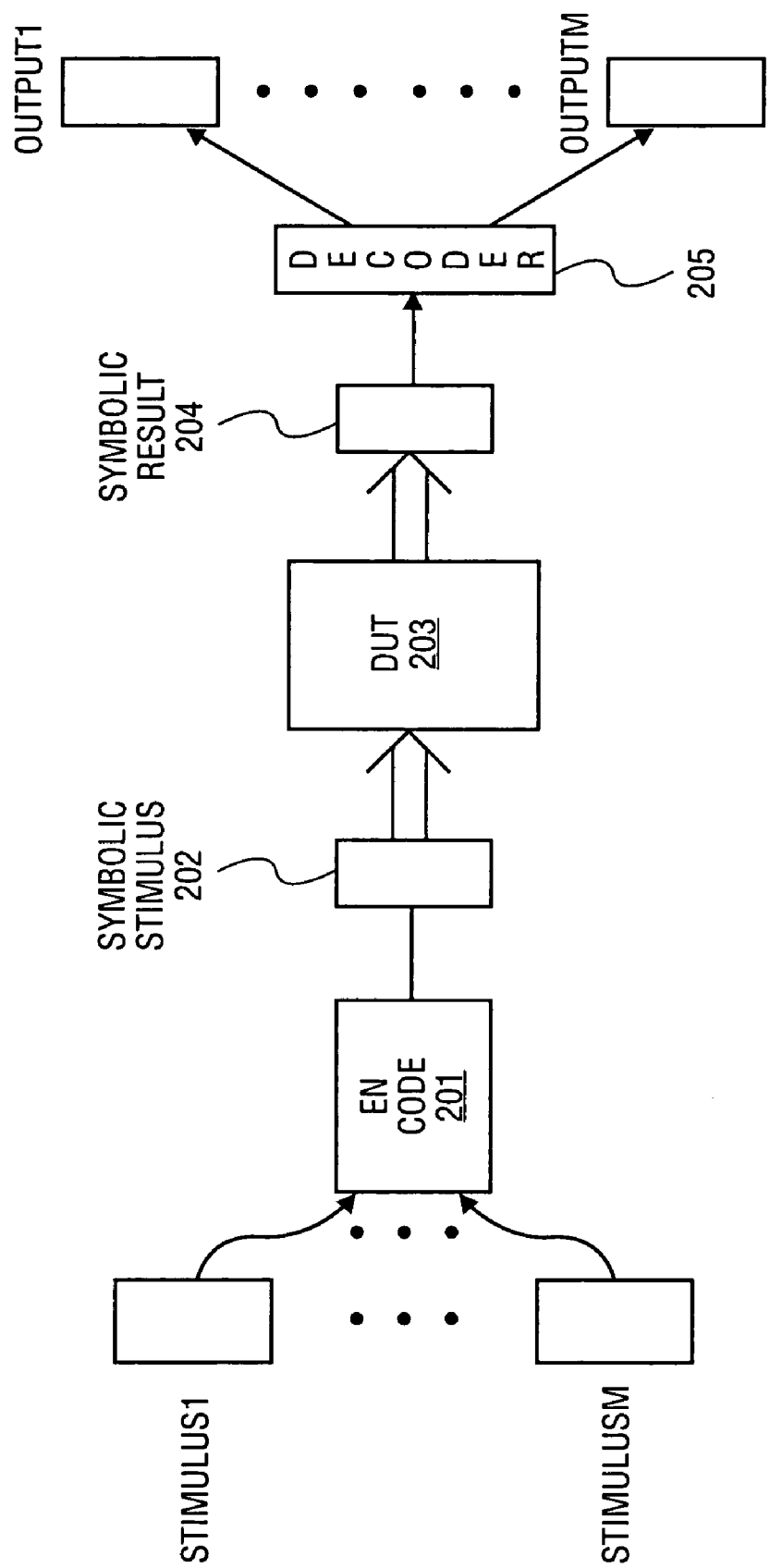
FIG. 2 is a data flow diagram of a symbolic simulation based verification environment.

FIG. 2 is a data flow diagram of a symbolic simulation based verification environment. Referring to FIG. 2, $stimulus_1$–$stimulus_M$ represent distinct test cases that are to be applied to the device under test (DUT). The $stimulus_1$–$stimulus_M$ are encoded by encoder 201 to generate a symbolic (encoded) stimulus 202, which is applied to DUT 203 during formal verification. In one embodiment, the encoding occurs off-line, and not dynamically while the simulation is occurring.

In one embodiment, the symbolic simulation based verification technique employed uses symbolic simulation, such as described in U.S. patent application Ser. No. 09/774,989, entitled "Circuit Simulation Using Encoding of Repetitive Subcircuits," filed Jan. 30, 2001, assigned to corporate assignee of the present invention and incorporated herein by reference. In response to symbolic stimulus 202, DUT 203 outputs a set of symbolic result 204. Symbolic result 204 comprises the results of the simulation for all of $stimulus_1$–$stimulus_M$. Symbolic result 204 is decoded by decoder 205, which produces $output_1$–$output_M$, each corresponding to one of $stimulus_1$–$stimulus_M$.

The present invention is different than traditional symbolic simulation. Symbolic simulation only takes variables which are thought to encode the whole possible $2^n$ space except for certain constraints. In the technique described herein, the existing binary stimuli are encoded and thus the input values assigned (driven) to the input ports are Boolean functions, instead of free variables with constraints. For example, if there are m input ports IN1, ..., INm, at certain time, the traditional symbolic simulator tries to drive them with V1, ..., Vm where V1, ..., Vm are Boolean variables with certain constraints (such as V1, ..., Vm should be mutual exclusive (at most one could be high)). The present invention drives IN1, ..., INm with F1(U1, ..., Up), F1(U1, ..., Up), ..., Fm(U1, ..., Up) Boolean functions as explained in more detail below.

Off-Line Encoding for Stimuli and Expected Results

Many times, the stimuli are generated by hand or by other program and the expected output values are generated by higher level or other golden reference models. For example, in a microprocessor design environment, the stimuli are machine code programs and the expected results are the memory and/or the values of machine registers at various machine simulation time based on an instruction level simulation model or even on an existing older generation of microprocessors.

For such situations, the stimuli and the expected results may be pre-calculated and encoded using the above scheme. By doing so, the time spent on encoding for each symbolic run could be amortized out since often the design is changed and the stimuli are not changed. Furthermore, the simulation result needs not be decoded back because performing a simple symbolic Boolean equality comparison for the simulated outputs and the encoded expected outputs should achieve the purpose.

Figure 3:
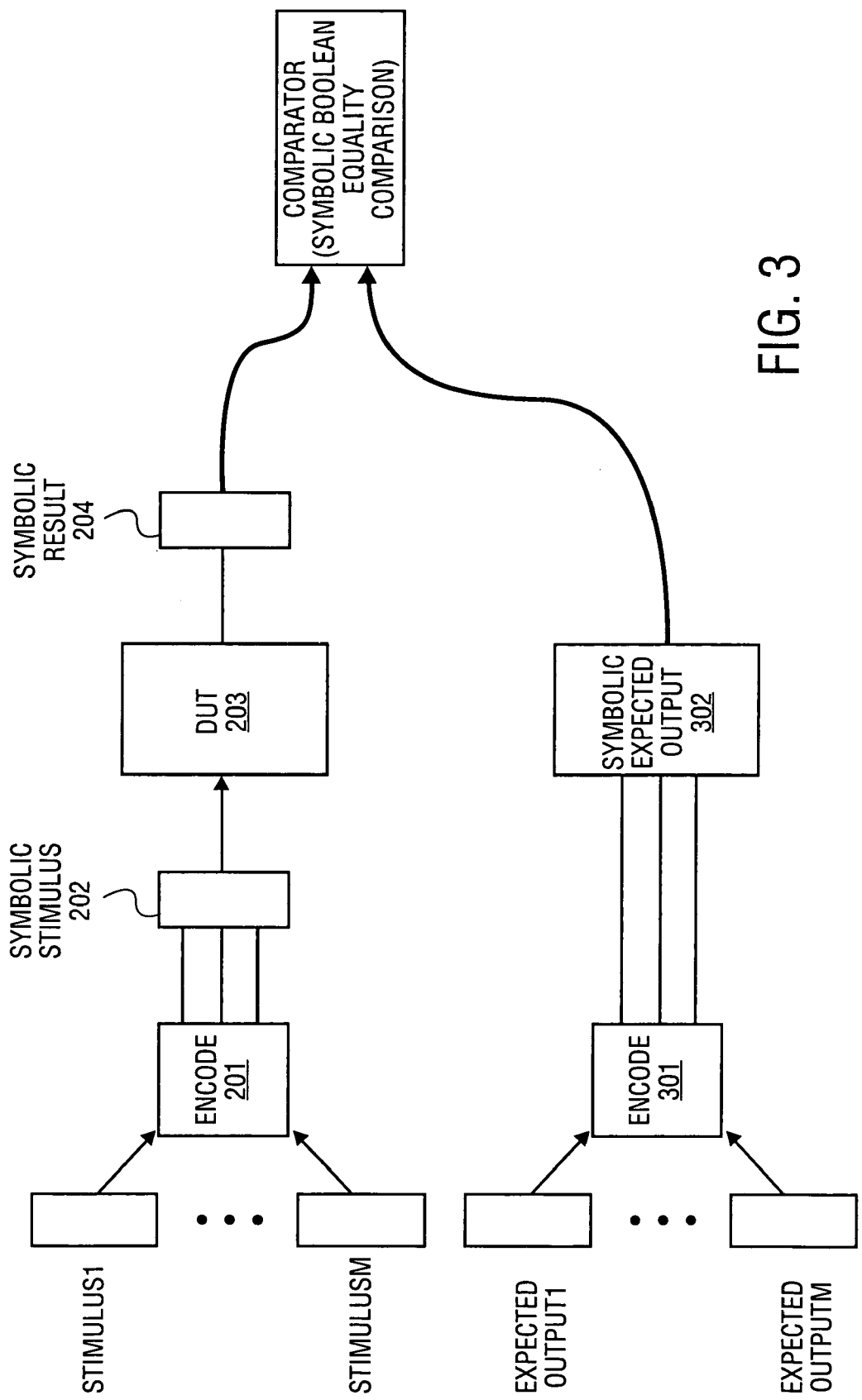
FIG. 3 is a data flow diagram of an alternative symbolic simulation based verification environment.

FIG. 3 is a data flow diagram of an alternative symbolic simulation based verification environment. Referring to FIG. 3, symbolic result 204 is generated in the same manner as in FIG. 2, however, symbolic result 204 is not decoded. Instead, a set of expected outputs, $expected\_output_1$–$expected\_output_M$, are encoded using encoder 301, which generates a symbolic expected output 302. Once symbolic result 204 is generated, it is compared to symbolic expected output 302 using comparison logic 303. In one embodiment, comparison logic 303 performs a symbolic Boolean equality comparison in a manner well-known in the art. Comparison logic 303 generates an indication (e.g., signal(s)) that indicates whether symbolic result 204 is the same as symbolic expected output 302, thereby verifying the DUT 203 is operating as expected.

When the off-line Boolean equality comparison is used for comparing the symbolic simulated results with the encoded expected results, if there is any difference between the two, one or all of the conditions that make the two results different could be generated. Such a condition represents a particular stimulus Si, and thus, the user could debug the difference using this stimulus. One way to do that is to rerun the simulation using this Si and produce the simulation trace/waveform for debugging. The other way is to capture the symbolic run information and replay that under this Si condition.

Encoding Random or Pseudo Random Test Stimulus in HDL

Sometimes, the test stimulus is generated on the fly during the simulation. If the stimulus is generated using an HDL random function such as, for example, $random system function call in Verilog HDL, special random function symbolic encoding could be introduced to simultaneously simulate M of random runs together.

Figure 4:
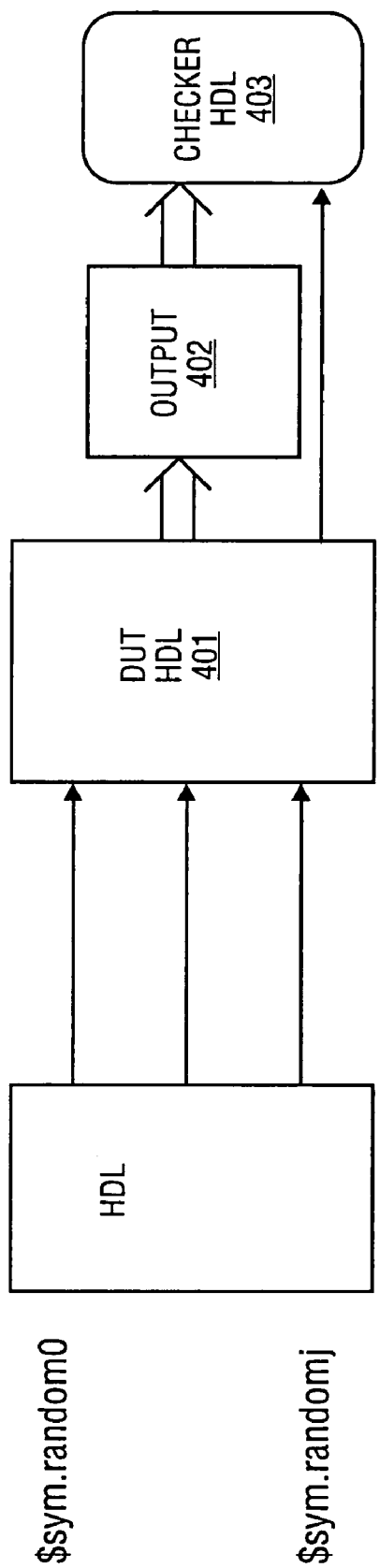
FIG. 4 illustrates one embodiment of a symbolic simulation based verification scheme in which test stimulus is pseudo random and generated on the fly during simulation.

FIG. 4 illustrates one embodiment of a symbolic simulation based verification scheme in which test stimulus is pseudo random and generated on the fly during simulation. Referring to FIG. 4, a series of Verilog HDL random function calls, referred to as $sym random( ), are executed and the input values are generated and applied to a DUT 401 that is being tested using an HDL test bench. The results of the application of the symbolic stimulus, referred to as output 402, are input to checker 403. Checker 403 determines whether output 402 matches the output that is expected of DUT 401 for the stimulus presented.

In an alternative embodiment, an encoded run scenario uses the function $sym_random(seed, M) is a function which encodes M $random(seed) numbers using logM bit of Boolean variables. Notice that the same logM bit boolean variables should be used for any $sym_random(seed, M) called in all locations.

For such an environment, if the checking part is based on the expected results produced by a reference model offline, the method of encoding and/or decoding the simulated results and checking the equivalence of the results against the expected ones described previous could be used.

If the output checking is self-contained in the HDL code that is simulated, the checking is carried out by the symbolic simulation of such portion of the HDL program automatically, making it possible to even simulate larger numbers of test stimuli at one symbolic simulation run.

It should be noted that the teachings of the present invention are applicable to hardware description language other than HDL as well, such as Veza and Specman 02, and languages such as the C programming languages.

Simulation Performance Comparison

Assume for M stimuli, the average time of simulating one stimulus for the DUT is T, the total time taken for simulating M stimuli is MT.

Further assume encoding M stimuli takes E amount of time, the time taken to symbolically simulate the encoded stimulus for the DUT is t and the decoding M stimuli takes MD (on average, each stimulus decoding takes D amount of time).

Without offline amortization, the total time for the symbolic encoding approach will take E+t+MD. One could clearly see that the D and T comparison could be a key here. If each stimulus takes a long time (i.e. T is large), the technique described herein may still outperform the traditional simulation (i.e. E+t+MD<MT).

For an environment where the stimuli and the expected results are fixed while the design DUT is changed frequently, requiring many runs for the same set of stimuli and the expected results, the performance is really between t vs. MT. In general, for a reasonable M such as from $2^{20}$ to $2^{30}$, t could be very well LT where L is <1000. For those cases, the simulation performance speedup is

MIL, which could be 1000 to 1000000 times for an M between $2^{20}$ to $2^{30}$.

Furthermore, if the symbolic simulation could simulate a large number of M (or logM bit of Boolean vectors (i.e., M is $2^n$, where n could be well over or close to 100), the simulation performance improvement is exponentially increased.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A method for verifying a device under test (DUT), the method comprising:
    encoding a plurality of input stimuli into a single symbolic stimulus, wherein each of the plurality of input stimuli represents one of a plurality of distinct test cases and comprises a set of test input values for a plurality of input ports of the DUT for each of a set of input times, wherein the single symbolic stimulus comprises a plurality of symbolic input values for the plurality of input ports for each of the set of input times, and wherein each of the plurality of symbolic input values is generated from a corresponding set of test input values from the plurality of input stimuli;
    symbolically simulating the device under test, including applying the single symbolic stimulus to the device under test; and
    outputting a symbolic result from the device under test in response to the single symbolic stimulus.

2. The method defined in claim 1 further comprising comparing the symbolic result with an encoded version of a symbolic expected output.

3. The method defined in claim 2 wherein comparing the symbolic result with a symbolic expected output comprises performing a symbolic Boolean equality comparison.

4. The method defined in claim 3 further comprising encoding a plurality of sets of expected outputs to create the symbolic expected output, each of the plurality of sets of expected outputs corresponding to one of the plurality of distinct test cases.

5. The method defined in claim 3 further comprising generating an indication indicating whether the symbolic result is the same as the symbolic expected output.

6. The method defined in claim 3 further comprising generating one or more conditions that caused the symbolic expected output to be different than the symbolic result.

7. The method defined in claim 6 wherein the one or more conditions represent a particular stimulus.

8. The method defined in claim 6 further comprising debugging the DUT using a particular stimulus representing the one or more conditions causing the symbolic result to be different from the symbolic expected output.

9. The method defined in claim 8 further comprising rerunning a simulation using the particular stimulus and producing a simulation trace.

10. The method defined in claim 1 further comprising decoding the symbolic result.

11. The method defined in claim 1 wherein symbolically simulating the DUT further comprises assigning Boolean functions to input ports.

12. An article of manufacture comprising one or more recordable media having executable instructions stored thereon which, when executed by the system, causes the system to:
    encode a plurality of input stimuli to create a single symbolic stimulus, wherein each of the plurality of input stimuli represent a distinct test case, wherein each of the plurality of input stimuli comprises a set of test input values for the input ports of a device under test (DUT) for each of a set of input times, wherein the single symbolic stimulus comprises a set of symbolic input values for the input ports of the DUT for each of the set of input times, each of the set of symbolic input values being generated from a corresponding set of test input values from the plurality of input stimuli;
    symbolically simulate the device under test (DUT), including applying the single symbolic stimulus to the device under test; and
    output a symbolic result from the device under test in response to the single symbolic stimulus.

13. The article of manufacture defined in claim 12 further comprising instructions which, when executed by the system, cause the system to compare the symbolic result with an encoded version of a symbolic result with an encoded version of a symbolic expected output.

14. The article of manufacture defined in claim 13 wherein instructions which, when executed by the system, cause the system to compare the symbolic result with a symbolic expected output by performing a symbolic Boolean equality comparison.

15. The article of manufacture defined in claim 14 further comprising instructions which, when executed by the system, cause the system to encode a plurality of sets of expected outputs to create the symbolic expected output.

16. The article of manufacture defined in claim 14 further comprising instructions which, when executed by the system, cause the system to generate an indication indicating whether the symbolic result is the same as the symbolic expected output.

17. The article of manufacture defined in claim 14 further comprising instructions which, when executed by the system, cause the system to generate one or more conditions that caused the symbolic expected output to be different than the symbolic result.

18. The article of manufacture defined in claim 17 wherein the one or more condition instructions which, when executed by the system, cause the system to represent a particular stimulus.

19. The article of manufacture defined in claim 17 further comprising instructions which, when executed by the system, cause the system to debug the DUT using a particular stimulus representing the one or more conditions causing the symbolic result to be different from the symbolic expected output.

20. The article of manufacture defined in claim 19 further comprising instructions which, when executed by the system, cause the system to rerun a simulation using the particular stimulus and producing a simulation trace.

* * * * *